(12) United States Patent
Chen et al.

(10) Patent No.: US 9,690,510 B2
(45) Date of Patent: Jun. 27, 2017

(54) TWO-STAGE READ/WRITE 3D ARCHITECTURE FOR MEMORY DEVICES

(71) Applicant: Taiwan Semiconductor Manufacturing Co., Ltd., Hsin-Chu (TW)

(72) Inventors: Kuang Ting Chen, Taipei (TW); Ching-Wei Wu, Caotun Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 246 days.

(21) Appl. No.: 14/259,607

(22) Filed: Apr. 23, 2014

(65) Prior Publication Data

US 2015/0309750 A1 Oct. 29, 2015

(51) Int. Cl.
| | |
|---|---|
| *G06F 13/00* | (2006.01) |
| *G06F 3/06* | (2006.01) |
| *G11C 5/02* | (2006.01) |
| *G11C 5/06* | (2006.01) |
| *G11C 7/10* | (2006.01) |
| *G11C 7/18* | (2006.01) |
| *H01L 27/06* | (2006.01) |
| *H01L 27/11* | (2006.01) |

(52) U.S. Cl.
CPC .......... *G06F 3/0625* (2013.01); *G06F 3/0665* (2013.01); *G06F 3/0689* (2013.01); *G11C 5/025* (2013.01); *G11C 5/063* (2013.01); *G11C 5/066* (2013.01); *G11C 7/1075* (2013.01); *G11C 7/18* (2013.01); *H01L 27/0688* (2013.01); *G11C 2207/108* (2013.01); *G11C 2207/2209* (2013.01); *G11C 2211/4016* (2013.01); *H01L 27/1104* (2013.01)

(58) Field of Classification Search
CPC ............ G06F 12/0607; G06F 13/1647; G06F 15/7857; G06F 13/1689; G11C 11/1693; G11C 11/2293; G11C 13/0061; G11C 16/32; G11C 7/22
USPC .............................................. 711/157, 167, 5
See application file for complete search history.

(56) References Cited

U.S. PATENT DOCUMENTS

| | | | | | |
|---|---|---|---|---|---|
| 4,600,986 | A | * | 7/1986 | Scheuneman | G06F 9/3824 711/157 |
| 5,680,364 | A | * | 10/1997 | Lee | G11O 5/025 365/185.2 |
| 5,864,505 | A | * | 1/1999 | Higuchi | G11C 7/1075 365/189.04 |
| 8,972,822 | B2 | * | 3/2015 | Nakano | G11C 11/4087 365/185.09 |

(Continued)

*Primary Examiner* — Sean D Rossiter
(74) *Attorney, Agent, or Firm* — Eschweiler & Potashnik, LLC

(57) ABSTRACT

Some embodiments of the present disclosure relate to a memory device wherein a single memory cell array is partitioned between two or more tiers which are vertically integrated on a single substrate. The memory device also includes support circuitry including a control circuit configured to read and write data to the memory cells on each tier, and a shared input/output (I/O) architecture which is connected the memory cells within each tier and configured to receive input data word prior to a write operation, and further configured to provide output data word after a read operation. Other devices and methods are also disclosed.

20 Claims, 9 Drawing Sheets

(56) References Cited

U.S. PATENT DOCUMENTS

| | | | | |
|---|---|---|---|---|
| 2008/0133809 A1* | 6/2008 | Saito | .................. | G06F 13/1647 |
| | | | | 710/106 |
| 2012/0014164 A1* | 1/2012 | Kamoshida | ........ | G11C 13/0004 |
| | | | | 365/148 |
| 2012/0224439 A1* | 9/2012 | Martinozzi | .......... | G11C 7/1009 |
| | | | | 365/189.16 |
| 2012/0263003 A1* | 10/2012 | Sakakibara | ....... | G11C 11/40615 |
| | | | | 365/222 |
| 2014/0219003 A1* | 8/2014 | Ebsen | ................ | G11C 13/0004 |
| | | | | 365/148 |

* cited by examiner

TWO-STAGE READ/WRITE 3D ARCHITECTURE FOR MEMORY DEVICES

BACKGROUND

Increasing memory capacity requirements within microelectronic devices manufactured in next-generation semiconductor technology nodes combined with lower power consumption and higher speed demands has driven an increase in the number of memory cells per bitline within memory arrays. Increasing the number of memory cells per bitline within memory arrays can be accomplished through scaling between technology nodes. However, the scaling factor for memory cells within an array can exceed that of support circuitry which surrounds the array.

DETAILED DESCRIPTION

Figure 1:
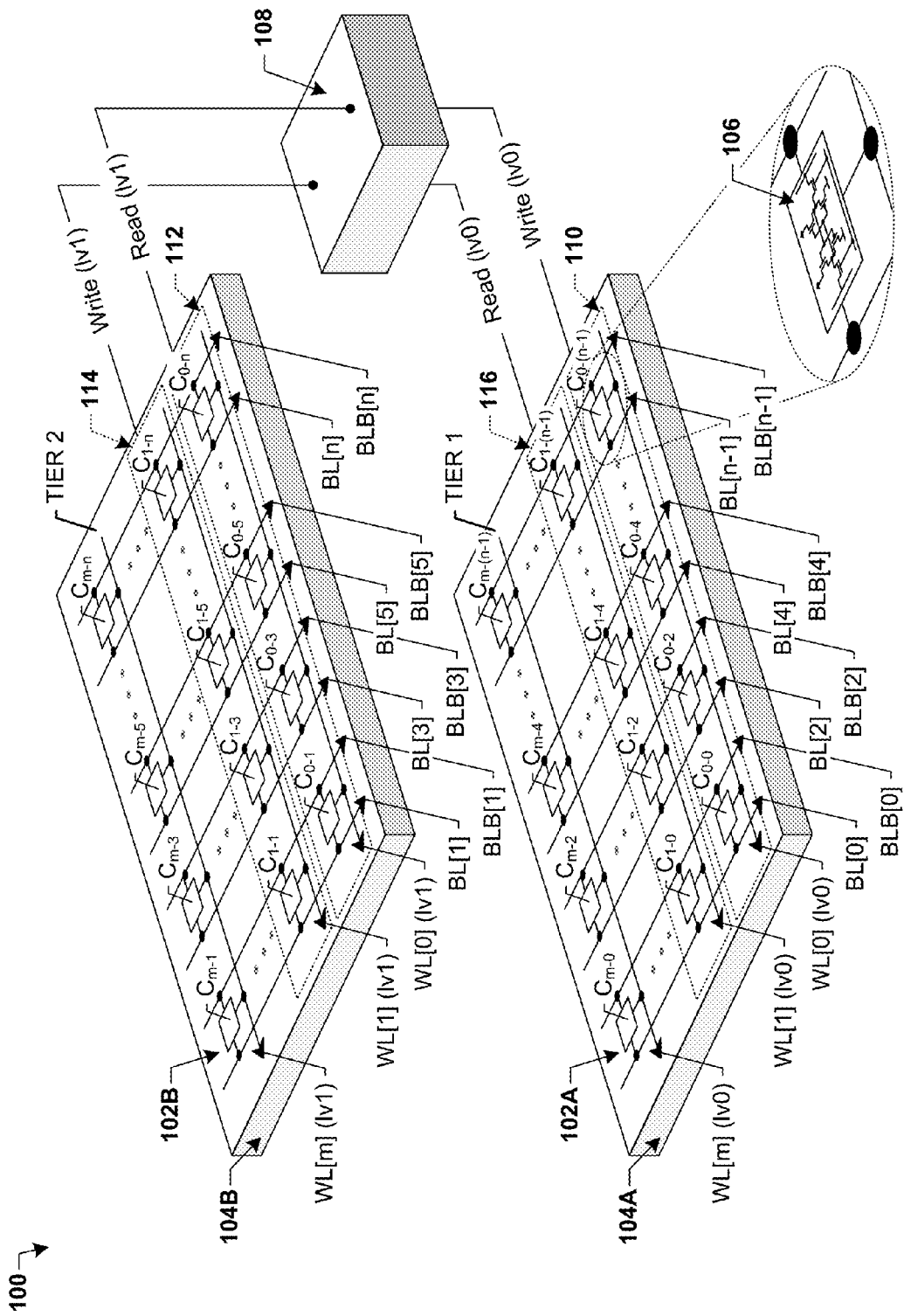
FIG. 1 illustrates some embodiments of a memory device comprising a first memory cell array on a first tier and a second memory cell array on a second tier.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor memory cells include volatile memory types such as static random-access memory (SRAM) or dynamic random-access memory (DRAM), or non-volatile memory types such as read-only memory (ROM), and non-volatile read-write memory (NVRWM) such as flash memory. A semiconductor memory device typically includes an array of such memory cells. Each memory cell in the array is capable of storing one or more bits of data. Therefore, an array arranged in M rows and N columns is able to store N bits of data within M words. One way to increase the capacity of the memory device (i.e., the number of bits it can store) is to shrink the memory cells making up the memory device, in accordance with Moore's Law scaling between semiconductor technology nodes, so that more memory cells can be fit into a smaller area.

Semiconductor scaling targets memory aggressively. As a result, the scaling factor for memory cells within the array is typically greater than the scaling factor for support circuitry which surrounds the array such as logic and analog components. Moreover, as scaling approaches the lower-bound of feature resolution achievable by optical lithography techniques, new means of scaling such as integrated chip (IC) stacking into three-dimensional (3D) chip architectures are utilized to decrease chip area. These 3D chip architectures include wafer-on-wafer, die-on-wafer, or die-on-die, which utilize bonded wafers that are electrically connected by through-silicon vias (TSVs) that are on the order of 10's of microns wide. More recently, monolithic 3D-IC integration has allowed for multiple device layers, or "tiers," to be stacked atop one-another within thin layers of silicon (Si), and electrically connected through inter-tier vias that are typically less than about 100 nm wide. The smaller size of an inter-tier via relative to a TSV eliminates some parasitic effects associated with the comparatively large TSV. This monolithic 3D-IC integration has therefore allowed for stacking of devices within a single chip, which can be applied not only to memory cells within a memory device, but also to the support circuitry as well.

Accordingly, some embodiments of the present disclosure relate to a memory device wherein a single memory cell array is partitioned between two or more tiers which are vertically integrated. The memory device also includes support circuitry including a control circuit configured to read and write data to the memory cells on each tier, and a shared input/output (I/O) architecture which is connected the memory cells within each tier and configured to receive input data word prior to a write operation, and further configured to provide output data word after a read operation. Other devices and methods are also disclosed.

FIG. 1 illustrates some embodiments of a memory device 100 comprising a first memory cell array 102A on a first tier 104A and a second memory cell array 102B on a second tier 104B. In some embodiments, the memory device 100 comprises a two-port register file (2prf) Static Random-Access Memory (SRAM), where the first memory cell array 102A is accessed through a first port, and the second memory cell array 102B is accessed through a second port. The 2prf SRAM has some advantages over a one-port register file (1prf) SRAM, including the ability to perform a read and write operations simultaneously within a single clock cycle, due to the multiple ports. The 1prf SRAM, by comparison, can only be written to, or read from, within a single clock cycle.

For the embodiments of FIG. 1, the second tier 104B is arranged over the first tier 104A. Other embodiments comprise three or more tiers arranged over one-another in an analogous fashion, so the combined footprint of the memory device 100 is the same as that of the single memory cells array within a respective tier. The first and second memory cell arrays 102A, 102B each comprise an N/2×M array of memory cells 106 (e.g., SRAM, EDRAM, etc.), indicated as $C_{ROW\text{-}COLUMN}$. The memory device 100 further comprises a control circuit 108 configured to perform a first read/write operation by writing a first data value (i.e., Write (Iv0)) to a first group of memory cells 110 (i.e., $C_{0\text{-}0}, C_{0\text{-}2}, \ldots C_{0\text{-}(n-1)}$) on the first tier 104A while concurrently reading a second data value (i.e., Read (Iv1)) from a second group of memory cells 112 (i.e., $C_{0\text{-}1}, C_{0\text{-}3}, \ldots C_{0\text{-}n}$) on the second tier 104B.

The control circuit 108 is further configured to perform a second read/write operation by writing a third data value (i.e., Write (Iv1)) to a third group of memory cells 114 (i.e., $C_{1\text{-}1}, C_{1\text{-}3}, \ldots C_{1\text{-}n}$) on the second tier 104B while concurrently reading a fourth data value (i.e., Read (Iv0)) from a fourth group of memory cells 116 (i.e., $C_{1\text{-}0}, C_{1\text{-}2}, \ldots C_{1\text{-}(n\text{-}1)}$) on the first tier 104A.

By partitioning the memory cells of the memory device 100 between the first and second tiers 104A, 104B, a greater storage density can be realized compared to conventional memory devices. Also, splitting individual word read operations and individual word write operations across the first and second tiers further helps improve storage density relative to conventional solutions.

Figure 2:
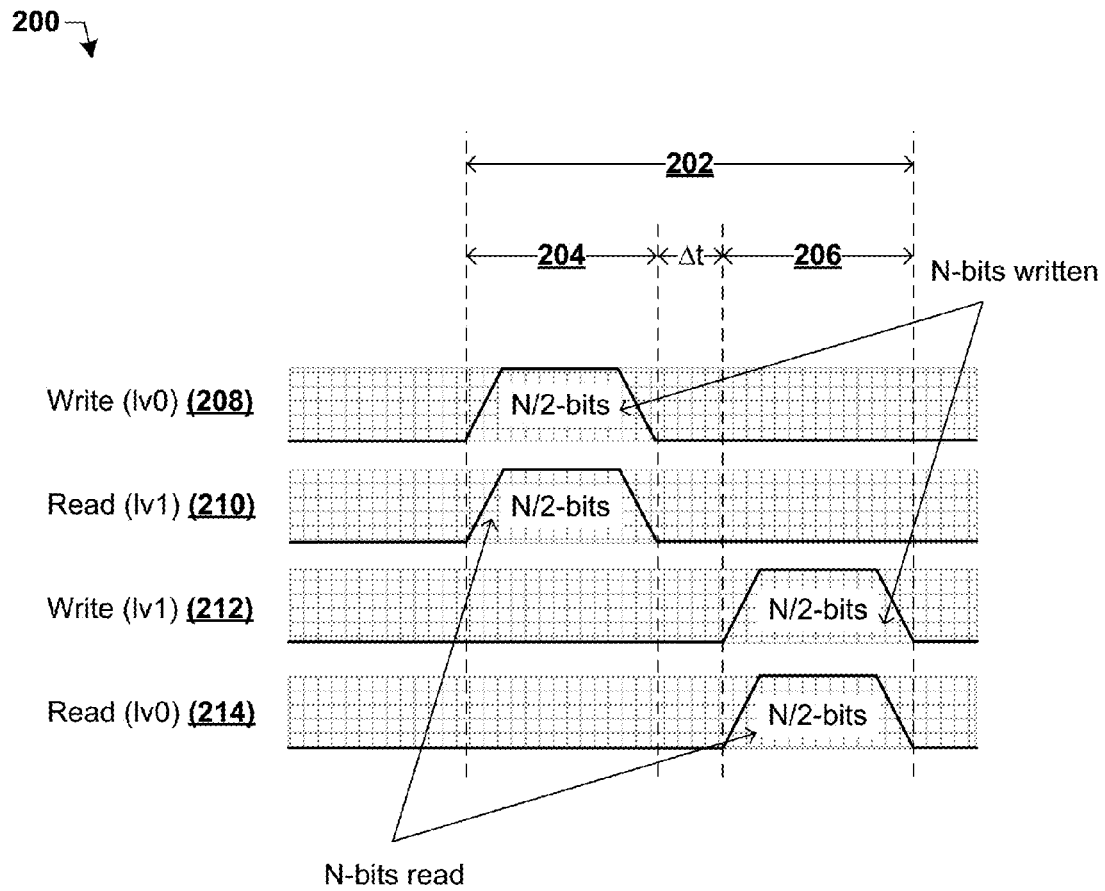
FIG. 2 illustrates an exemplary embodiment of a read/write timing diagram for the memory device of FIG. 1.

FIG. 2 illustrates an exemplary embodiment of a read/write timing diagram 200 for the memory device 100, and is described below with reference to the features of FIG. 1. In some embodiments, the read/write timing diagram 200 applies to a memory device 100 comprising a 2prf SRAM. The read/write timing diagram 200 illustrates a read/write operation 202 where a first N-bit input data word is written to the memory device 100, while a second N-bit output data word is concurrently read from the memory device 100.

The write portion of this read/write operation 201 is now described. Prior to the start of the read/write operation 202, an N-bit input data word and a write address where the N-bit input data word to be written are provided to the memory device 100. During a first time interval 204, a memory controller (108, FIG. 1) then writes a first data value, Write (Iv0) 208 (which corresponds to a first N/2 bits of the N-bit input data word) to the first memory cell array 102A (i.e., through a first port). During a second time interval 206, the memory controller writes a third data value, Write (Iv1) 212 (which corresponds to a second N/2 bits of the N-bit input data word) to the second memory cell array 102B (i.e., through a second port). In some embodiments, the second time interval 206 directly follows the first time interval 204. For the embodiments of the timing diagram 200, there is a time delta (Δt) between the first and second time intervals 204, 206. Hence, at the end of the read/write operation 202, the full N-bit input data word has been written to the memory device 100, albeit with the N-bits of the input data word being split between the first and second tiers 104A, 104B.

Likewise, prior to the start of the read/write operation 202, a read address is provided from which an N-bit output data word is to be read. During the first time interval 204, a second data value, Read (Iv1) 210 (which corresponds to a first N/2-bits of the N-bit output data word) is accessed from the second memory cell array 102B (i.e., through the second port). During the second time interval 206, a fourth data value, Read (Iv0) 214 (which corresponds to the second N/2 bits of the N-bit output data word) is accessed from the first memory cell array 102A (i.e., through the first port). At the end of the read/write operation 202, the N-bit output data word is then provided to output pins of the memory device 100, wherein the N-bits of the output data word have been "gathered" from over the first and second tiers 104A, 104B.

Figure 3:
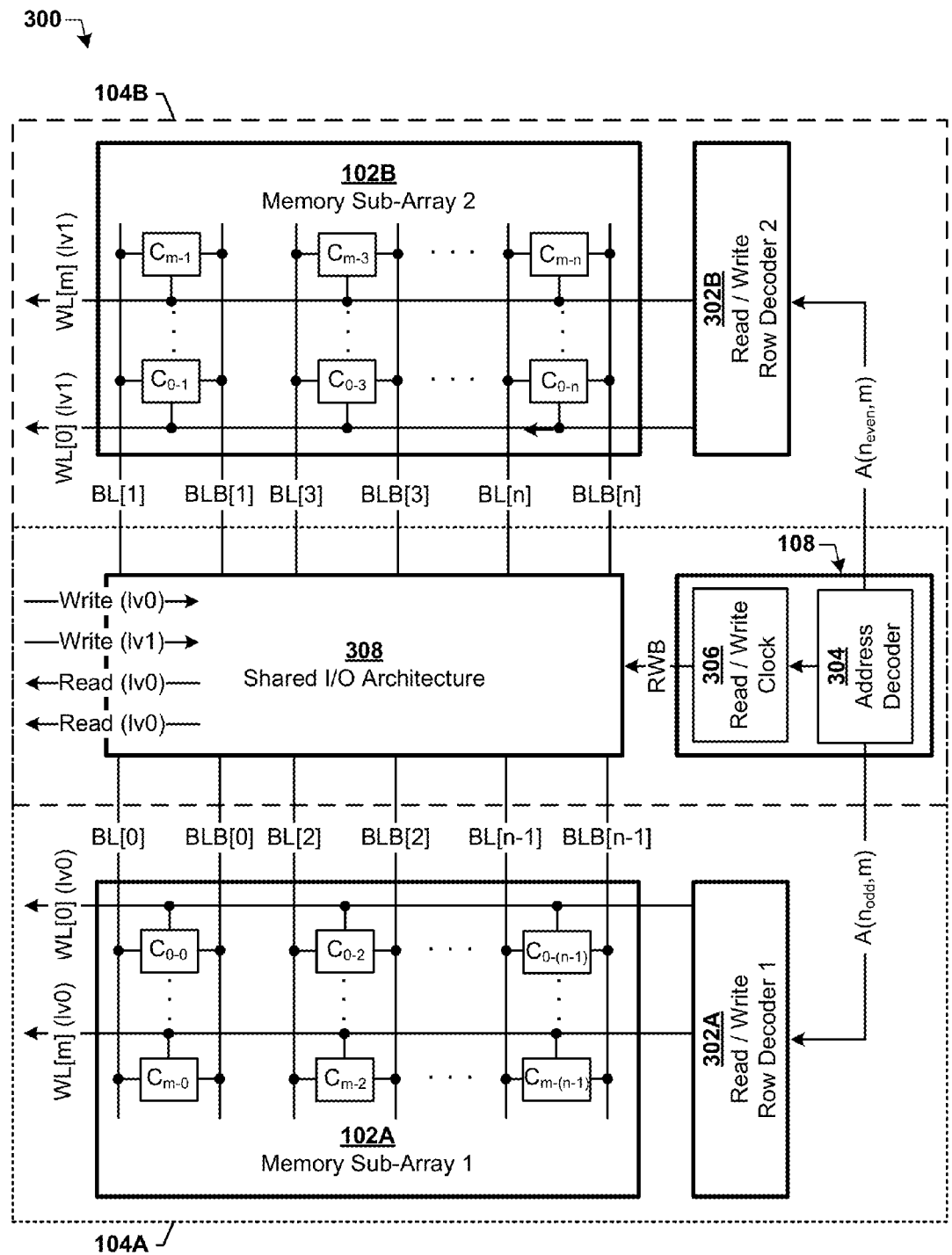
FIG. 3 illustrates some embodiments of a memory device comprising first and second memory cell arrays residing on first and second tiers, respectively, a control circuit configured to perform read/write operations to the first and second memory cell arrays, and a shared input/output (I/O) architecture configured to receive an input data word and further configured to output an output data word.

FIG. 3 illustrates some embodiments of a memory device 300 comprising first and second memory cell arrays 102A, 102B residing on first and second tiers 104A, 104B. The first and second memory cell arrays 102A, 102B are coupled to first and second row decoders 302A, 302B, respectively. The memory device 300 further comprises a control circuit 108 configured to perform read/write operations to the first and second memory cell arrays 102A, 102B. The control circuit 108 comprises an address decoder 304 configured to identify an odd or even address, $A(m,n_{odd})$ or $A(m,n_{even})$ within the first or second memory cell arrays 102A, 102B, respectively. $A(m,n_{odd})$ or $A(m,n_{even})$ correspond to a word line WL[0]-WL[m] (Iv0) or WL[0]-WL[m] (Iv1) within the first or second memory cell arrays 102A, 102B, respectively. The control circuit 108 further comprises a read/write clock (clk) 306 configured to generate a read/write clk signal (RWB), which is sent to a shared input/output (I/O) architecture 308 to control writing of input data to, and reading of output data from, the first and second memory cell arrays 102A, 102B.

The shared I/O architecture 308 is connected to the first memory cell array 102A through first complimentary bitlines BL[0], BL[2], ... BL[n-1], BLB[0], BLB[2], ... BLB[n-1], and connected to the second memory cell array 102B through second complimentary bitlines BL[1], BL[3], ... BL[n], BLB[1], BLB[3], ... BLB[n]. The shared I/O architecture 308 is configured to receive first and second data values, Write (Iv0) and Read (Iv1), as inputs and outputs, respectively, of the first read/write operation, and further configured to receive the third and fourth data values, Write (Iv1) and Read (Iv0), as inputs and outputs, respectively, of the second read/write operation. Details of the operation of the shared I/O architecture 308 will be demonstrated in subsequent embodiments.

Figure 4A:
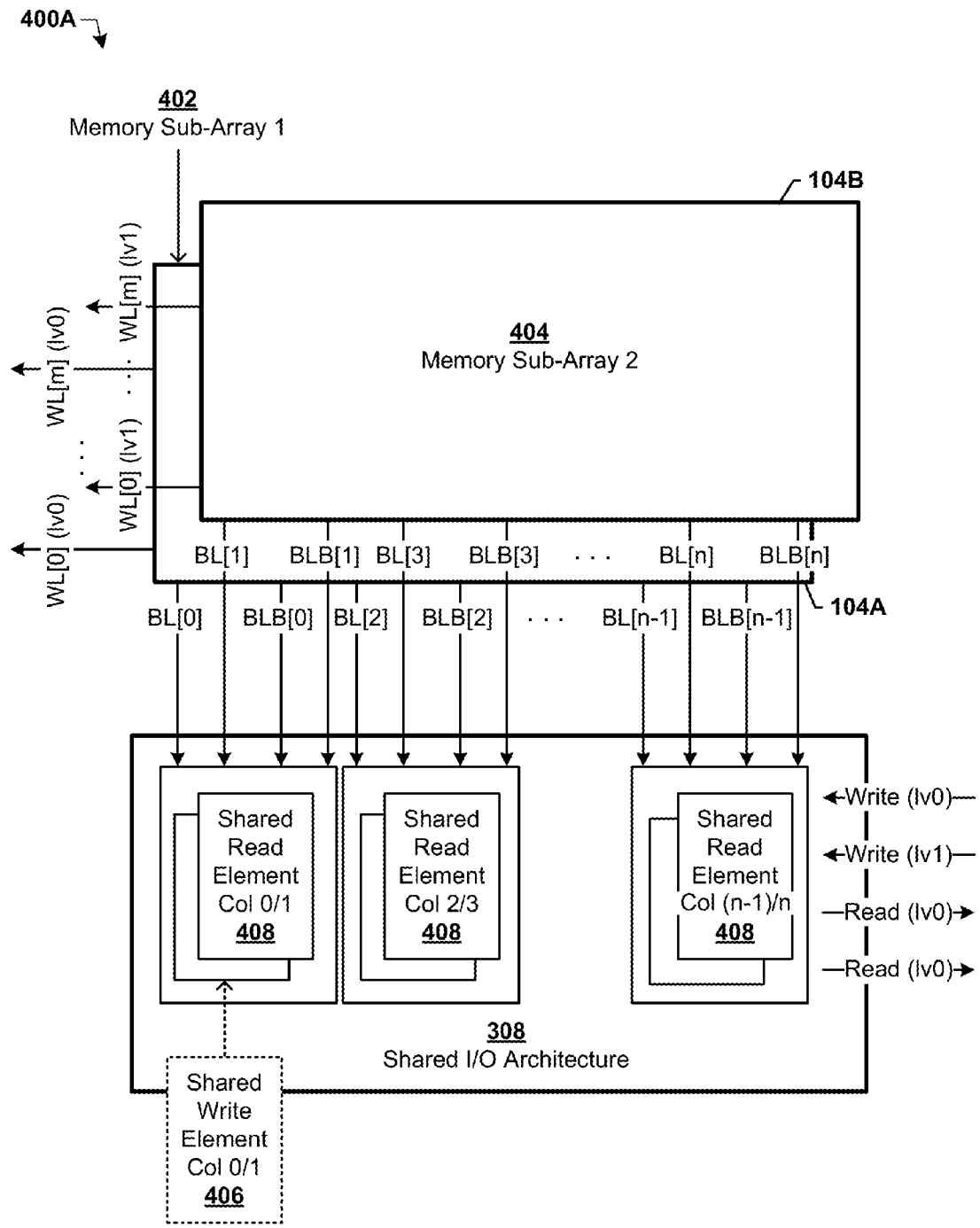
FIGS. 4A-4C illustrate some embodiments of the shared I/O architecture of FIG. 3.

FIG. 4A illustrates some further embodiments of the shared I/O architecture 308. The shared I/O architecture 308 is again connected to first and second memory sub-arrays 402, 404. The first memory sub-array 402 resides on a first tier 104A and the second memory sub-array 404 resides on a second tier 104B. In the physical design (i.e., the manufactured circuit), the second tier 104B is arranged in an 3D-IC package which encloses both the first and second tiers 104A, 104B so the second tier 104B is arranged over the first tier 104A, and subsequently the second memory sub-array 404 is arranged directly over the first memory sub-array 402. For an N×M memory array, this arrangement reduces the overall footprint of the array by about 50%, as half of the cells are placed on the second tier over the first tier.

In some embodiments of an N×M memory array, odd columns, or first complimentary bitlines, BL[0], BL[2], ... BL[n-1], BLB[0], BLB[2], ... BLB[n-1], are partitioned into a first sub-array 402 residing on the first tier 104A, and the remaining even columns, or second complimentary bitlines, BL[1], BL[3], ... BL[n], BLB[1], BLB[3], ... BLB[n] are partitioned into a second sub-array 404 residing on the second tier 104B. As a result, an even column of the second sub-array 404 resides directly over an odd column of the first sub-array 402. Within the shared I/O architecture 308 input data is written to a respective column of the first or second sub-array 402, 404 by a shared write element 406. Likewise, output data is read from a respective column of the first or second sub-array 402, 404 by a shared read element 408. To further reduce area in the physical design, the shared read element 408 is arranged on the second tier 104B over the shared write element 406 on the first tier 104A, or vice versa, to further reduce the overall footprint.

Collectively, the shared write elements 406 are configured to receive first and third data values, Write (Iv0) and Write (Iv1), and to write the first data value Write (Iv0) to a first group of memory cells (i.e., row) within the first sub-array 402, and to successively write the third data value Write (Iv1) to a third group of memory cells (i.e., row) within the second sub-array 404. Similarly, the shared read elements 408 are collectively configured to read a second data value Read (Iv1) from a second group (i.e., row) of memory cells within the second sub-array 404, and to successively read a fourth data value Read (Iv0) from a fourth group (i.e., row) of memory cells within the first sub-array 404.

Figure 4B:
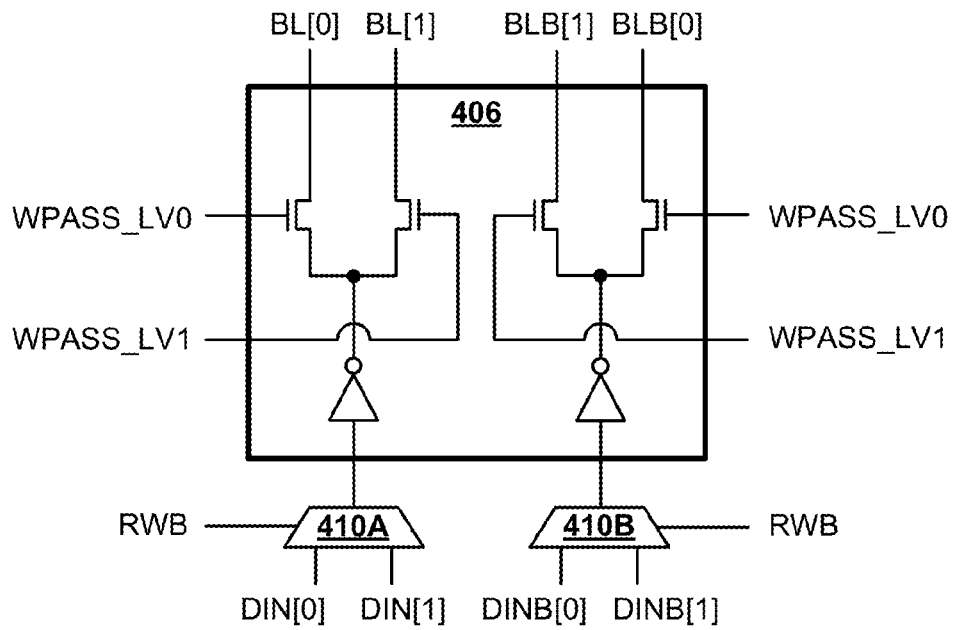

FIG. 4B illustrates some embodiments of a shared write element 406. The shared write element 406 comprises first and second multiplexers (muxs) 410A, 410B configured to select between first or second complimentary input data signals DIN[0], DINB[0] or DIN[1], DINB[1], respectively, in response to the read/write clk signal (RWB). The shared write element 406 passes the first or second complimentary input data signals DIN[0], DINB[0] or DIN[1], DINB[1] to first or second complimentary bitlines BL[0], BLB[0] or BL[1], BLB[1], respectively, when a WPASS_LV0 signal or WPASS_LV1 signal is asserted, respectively, as will be demonstrated in FIG. 6.

Figure 4C:
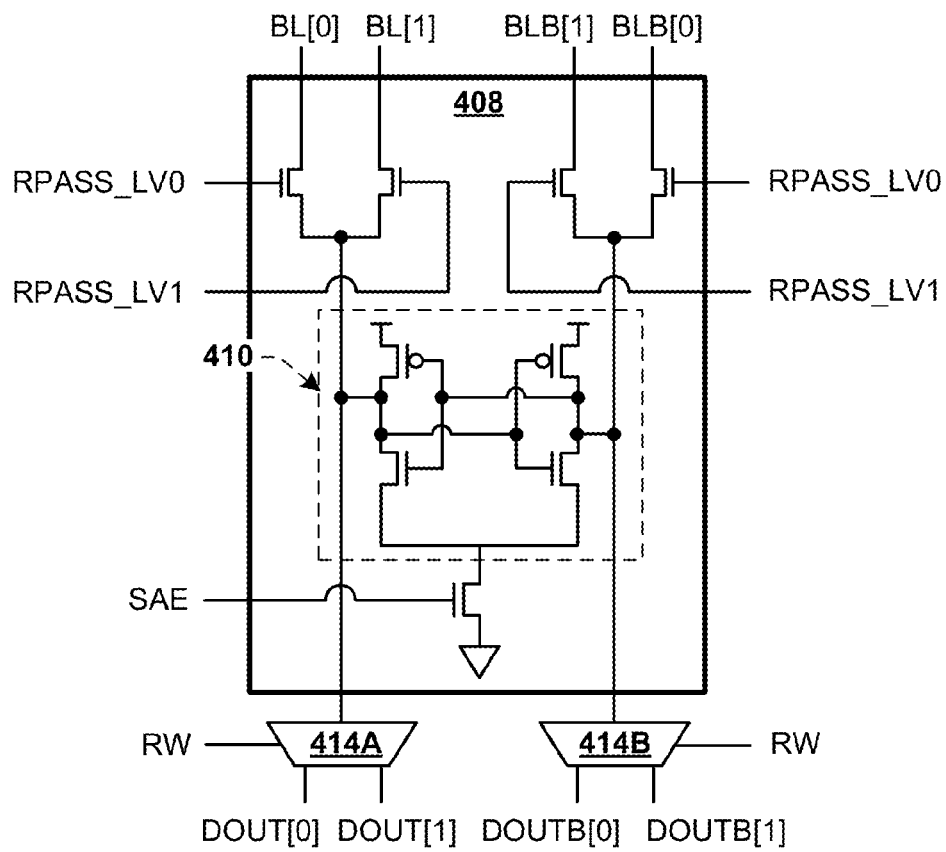

FIG. 4C illustrates some embodiments of a shared read element 408. The shared read element 408 is configured to receive a first or second complimentary output data signal, DOUT[0], DOUTB[0] or DOUT[1], DOUTB[1], from the first or second complimentary bitlines BL[0], BLB[0] or BL[1], BLB[1], respectively, in response to a RPASS_LV0 signal or RPASS_LV1 signal, respectively, as again will be demonstrated in FIG. 6. The shared read element 408 comprises a differential sense amplifier (SA) 410, comprising cross-coupled inverters, and configured to amplify the first or second complimentary output data signals, DOUT[0], DOUTB[0] or DOUT[1], DOUTB[1]. When the RPASS_LV0 signal or RPASS_LV1 signal is asserted, the first or second complimentary output data signals, DOUT[0], DOUTB[0] or DOUT[1], DOUTB[1] charge internal nodes of the differential SA 410 to slightly different potentials. The cross-coupled inverters of the differential SA 410 each comprise a pull-down element (e.g., an n-type transistor on series with a p-type transistor). When potentials discharge, the delta in voltage in conjunction with the cross-coupled configuration results in the smaller of DOUT[0], DOUTB[0] or DOUT[1], DOUTB[1] being pulled to ground (i.e., logical "0") with the larger of DOUT[0], DOUTB[0] or DOUT[1], DOUTB[1] being pulled to its original potential (i.e., logical "1"). The shared read element 408 further comprises first and second de-multiplexers (de-muxs) 414A, 414B configured to select between the first or second complimentary output data signals DOUT[0], DOUTB[0] or DOUT[1], DOUTB[1], in response to the read/write clk signal (RWB).

Figure 5:
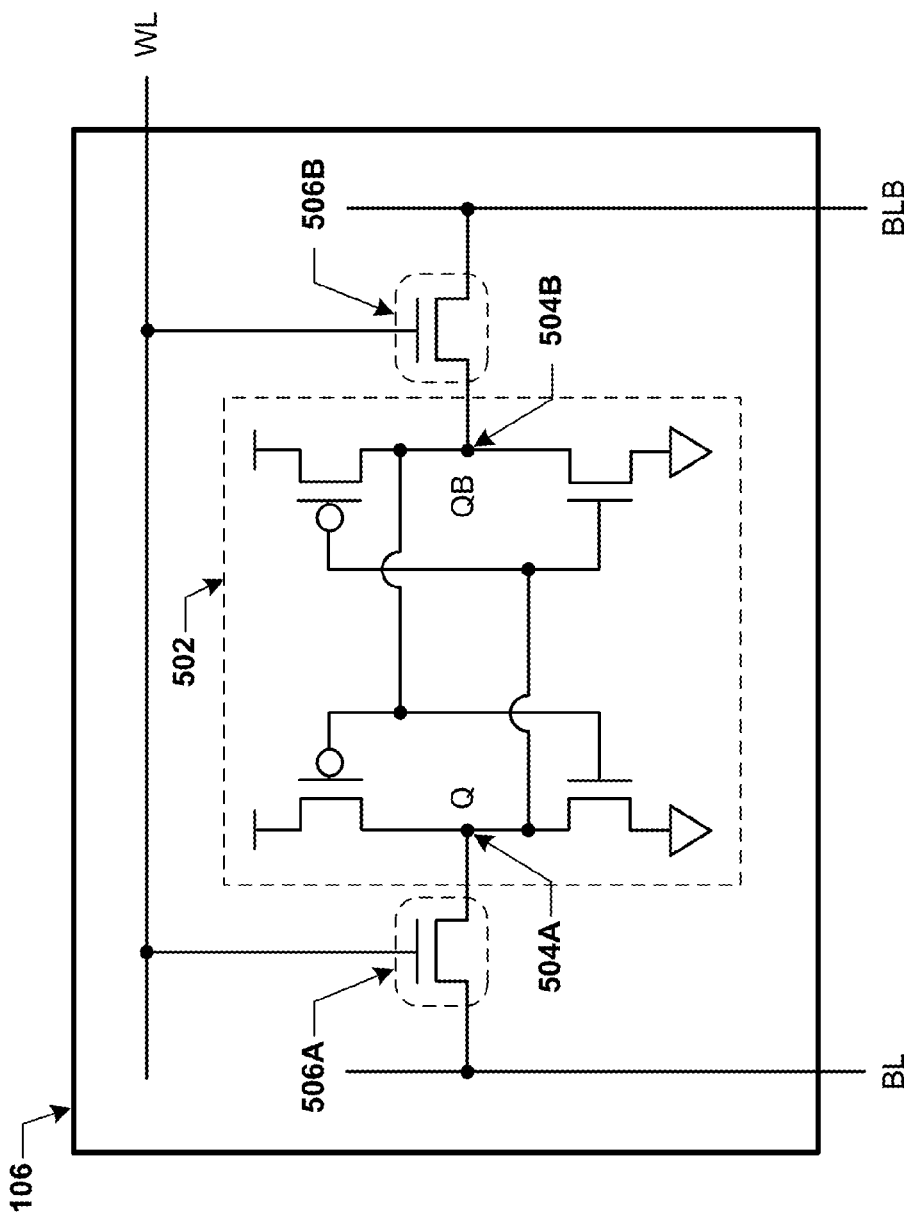
FIG. 5 illustrates some embodiments of a memory cell comprising a static random access memory (SRAM) cell.

In some embodiments, the memory cell 106 comprises an SRAM cell for a 2prf memory device, as is illustrated in FIG. 5. For the embodiments of FIG. 5, the memory cell 106 comprises a six-transistor (6T) SRAM, further comprising cross-coupled inverters 502 configured to store data (i.e., a single bit) on complimentary storage nodes 504A, 504B. The memory cell 106 is coupled to complimentary bitlines (BL and BLB) through first and second pass gates 506A, 506B, which are controlled by a wordline (WL). In write mode, input data values DIN[0], DINB[0] or DIN[1], DINB[1] are applied to BL and BLB by the shared write element 406. The WL is then set to high which allows the input data value and its compliment to pass to the cross-coupled inverters 502, where it is stored as a voltage on the complimentary storage nodes 504A, 504B, as Q and QB, respectively To read a data value from the memory cell 106, the complimentary bitlines BL, BLB are first decoupled from the cross-coupled inverters 502 by opening the cross-coupled inverters 502 (i.e., setting the signal WL=0), thereby decoupling the complimentary bitlines BL, BLB from the complimentary storage nodes 504A, 504B. While decoupled, charge is leaked from a supply voltage $V_{DD}$ onto the complimentary bitlines BL, BLB. This pre-charged condition often represents a condition where the complimentary bitlines BL, BLB are charged to $V_{DD}$, meaning that both complimentary bitlines BL or BLB are in a logical "1" state. After pre-charging to the complimentary bitlines BL, BLB, the first and second pass gates 506A, 506B are again opened, causing the voltages stored on the complimentary storage nodes 504A, 504B, Q and QB, to transfer to the complimentary bitlines BL, BLB, respectively. The transferred voltages are then output as the complimentary output data signal, DOUT[0], DOUTB[0] or DOUT[1], DOUTB[1], and sent to the shared read element 408.

Figure 6:
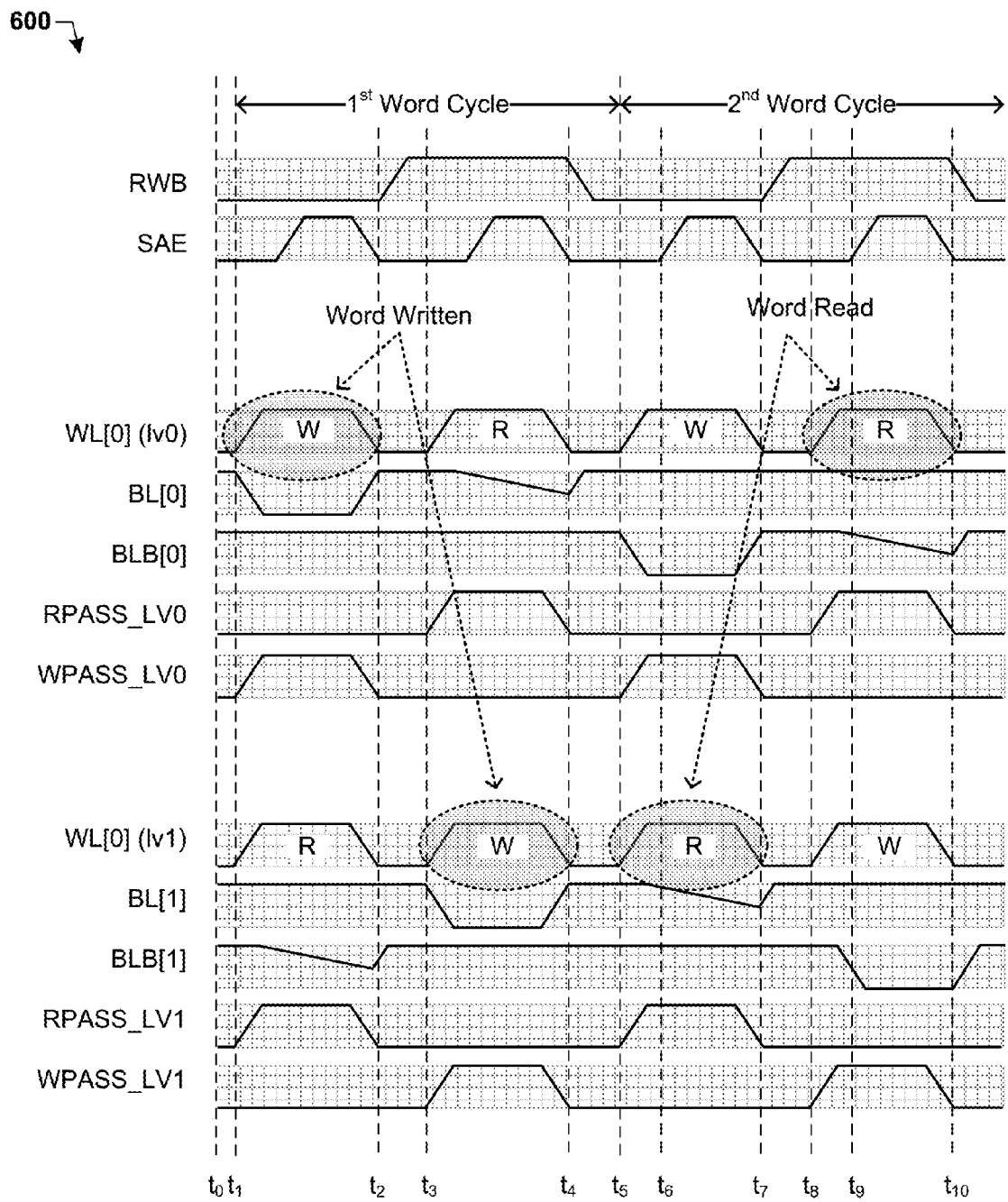
FIG. 6 illustrates some embodiments of a timing diagram for a two-tier read/write operation for a memory array comprising SRAM cells.

FIG. 6 illustrates some embodiments of a timing diagram 600 for the two-tier read/write operation for a memory array comprising SRAM cells, and is described below with reference to the features of FIGS. 4A-4C and FIG. 5. It is appreciated that the general formulation of the timing diagram 600 and associated two-tier read/write operation for a memory array may be applied to various memory types such as SRAM, dynamic random-access memory (DRAM), or non-volatile read-write memory (NVRWM) such as flash memory, and the like.

At $t_0$ complimentary bitlines BL[0]/BLB[0] are pre-charged (or reset) to $V_{DD}$ (i.e., logical "1" state). Also at $t_0$ read/write clk signal (RWB) is 0, corresponding to a low (i.e., "0") read clk state, and a high (i.e., "1") write clk state.

At $t_1$ WPASS_LV0 is asserted in the shared write element 406 so that Iv0 complimentary bitlines BL[0]/BLB[0] receive first complimentary input data signals DIN[0]/DINB[0]. Also at $t_1$, WL[0] (Iv0) is simultaneously asserted so that the values of DIN[0]/DINB[0] are stored as a voltage on the complimentary storage nodes 504A, 504B of a Iv0 memory cell 106.

At $t_2$ WPASS_LV0 returns to 0 and a first half of a first write operation is complete. Also at $t_2$, complimentary bitlines BL[0]/BLB[0] are pre-charged (or reset) to $V_{DD}$. Also at $t_2$, RWB is simultaneously asserted so that the first and second muxs 410A, 410B select the second complimentary input data signals DIN[1]/DINB[1] as inputs to the shared write element 406.

At $t_3$ WPASS_LV1 is asserted in the shared write element 406 so that Iv1 complimentary bitlines BL[1]/BLB[1] receive the second complimentary input data signals DIN[1]/DINB[1]. Also at $t_3$, WL[0] (Iv2) is simultaneously asserted so that the values of DIN[1]/DINB[1] are stored as a voltage on the complimentary storage nodes 504A, 504B of a Iv1 memory cell 106.

At $t_4$ WPASS_LV1 returns to 0 and a second half of the first write operation is complete. Also at $t_4$, complimentary bitlines BL[1]/BLB[1] are pre-charged (or reset) to $V_{DD}$.

At $t_5$ a first word cycle is complete. Note that the first (N-bit) write operation illustrated for Iv0 and Iv1 memory cells 106 above occurs within the first word cycle occurs simultaneously with a first read operation. Likewise, second write and read operations occur simultaneously within a second word cycle which immediately follows the first word cycle.

Simultaneously, at $t_5$ the second word cycle begins (i.e., $\Delta t=0$). BL[1] and BLB[1] are charged to $V_{DD}$. WL[0] (Iv1) is asserted, which couples BL[1], BLB[1] to the Iv1 memory cell 106. And, RPASS_LV1 is simultaneously asserted in the shared read element 408.

At $t_6$ SAE is asserted, and DOUT[1]/DOUTB[1] are read from BL[1]/BLB[1] through the first and second de-muxs 414A, 414B of the shared read element 408. As a result, at $t_6$ the differential SA 410 senses the voltage difference between BL[1] and BLB[1].

At $t_7$ RPASS_LV1 returns to zero and a first half of the second read operation is complete.

At $t_8$ BL[0] and BLB[0] are charged to $V_{DD}$. WL[0] (Iv0) is asserted, which couples BL[0], BLB[0] to the Iv0 memory cell 106. And, RPASS_LV0 is simultaneously asserted in the shared read element 408.

At $t_9$ SAE is asserted, and DOUT[0]/DOUTB[0] are read from BL[0]/BLB[0] through the first and second de-muxs 414A, 414B of the shared read element 408. As a result, at $t_9$ the differential SA 410 senses the voltage difference between BL[0] and BLB[0].

At $t_{10}$ RPASS_LV0 returns to zero and a second half of the second read operation is complete.

Note that for the embodiments of a timing diagram 600 signals can be shared between the shared write element 406 and the shared read element 408. For instance, WPASS_LV1=RPASS_LV0, and RPASS_LV1=WPASS_LV0. Moreover, as illustrated in FIGS. 4C-4C, RWB controlling the first and second muxs 410A, 410B of the shared write element 406 may be inverted to generate RW to control the first and second de-muxs 414A, 414B of the shared read element 408

Figure 7:
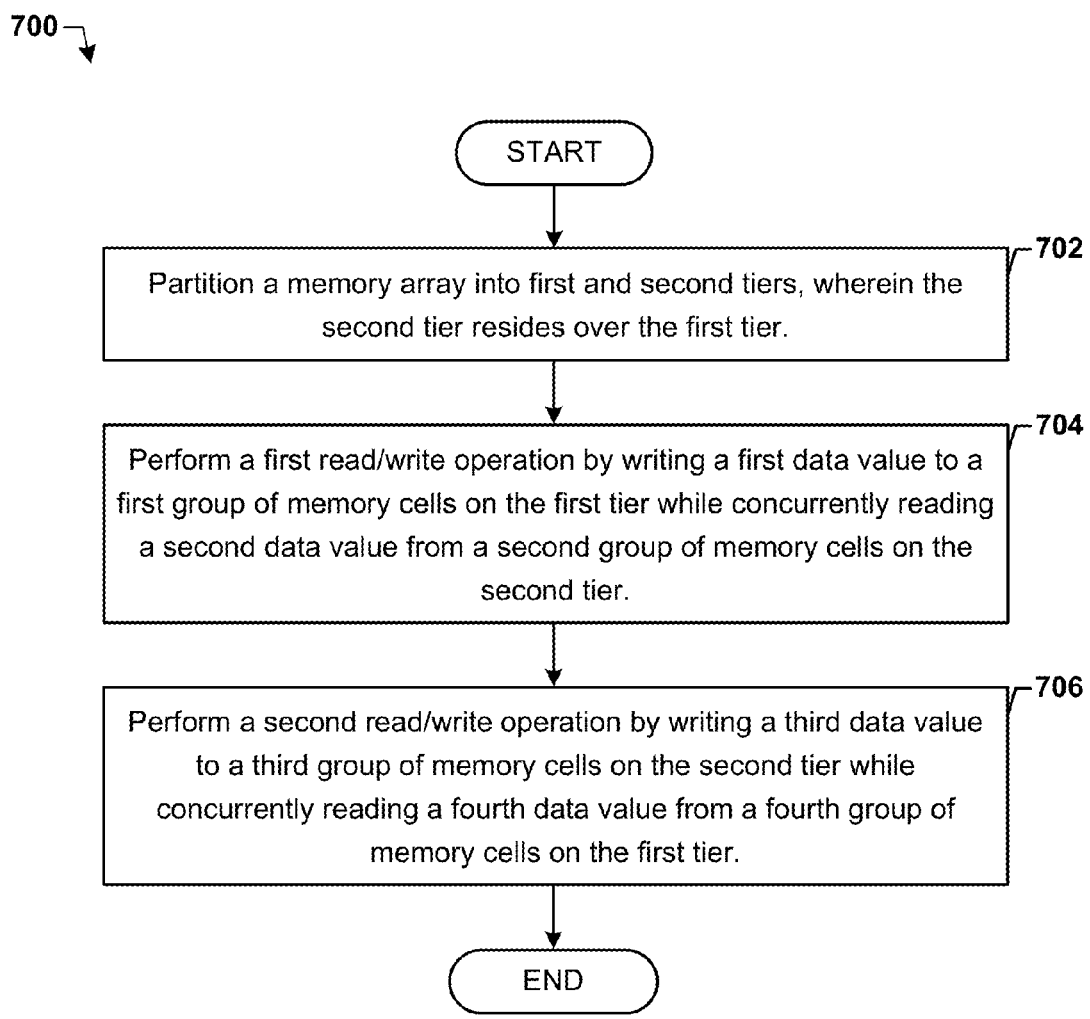
FIG. 7 illustrates some embodiments of a method to read and write memory.

FIG. 7 illustrates some embodiments of a method 700 to read and write memory. While the method 700 is described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702 a memory array is partitioned into first and second tiers, wherein the second tier resides over the first tier. In some embodiments, the memory array comprises an N-bit memory array further comprising M rows and N columns. In some embodiments, partitioning the N-bit memory array into first and second tiers comprises forming a first sub-array comprising M rows and N/2 columns, where the N/2 columns of the first sub-array comprise odd numbered columns of the memory array. These embodiments further comprise forming a second sub-array comprising M rows and N/2 columns, where the N/2 columns of the second sub-array comprise even numbered columns of the N-bit memory array.

At 704 a first read/write operation is performed by writing a first data value to a first group of memory cells on the first tier while concurrently reading a second data value from a second group of memory cells on the second tier.

At 706 a second read/write operation is performed by writing a third data value to a third group of memory cells on the second tier while concurrently reading a fourth data value from a fourth group of memory cells on the first tier.

In some embodiments of the method 700, the first data value is made up of N/2-bits and the third data value is made up of N/2-bits such that the first and third data values collectively correspond to an N-bit input data word provided to the memory array prior to the first read/write operation. In some embodiments of the method 700, the second data value is made up of N/2-bits and the fourth data value is made up of N/2-bits such that the second and fourth data values collectively correspond to an N-bit output data word provided by the memory array after the first read/write operation.

Figure 8A:
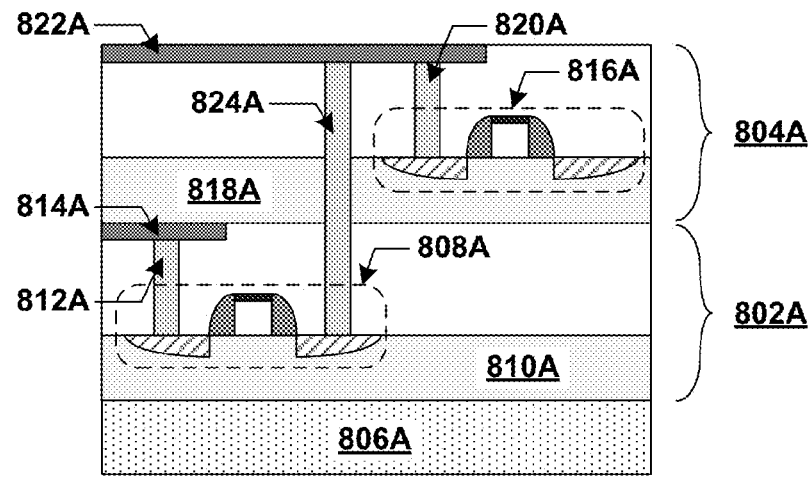
FIGS. 8A-8B illustrate cross-sectional views of some embodiments of a memory device comprising a three-dimensional (3D) integrated chip (IC).

FIG. 8A illustrates a cross-sectional view of some embodiments of a memory device 800A comprising a 3D-IC, further comprising a first tier 802A vertically disposed below a second tier 804A on a semiconductor substrate 806A. In various embodiments, the semiconductor substrate 806A may comprise any type of semiconductor body (e.g., silicon, silicon-germanium, silicon-on-insulator, etc.) such as a semiconductor wafer and/or one or more die on a semiconductor wafer, as well as any other type of semiconductor associated therewith.

The first tier 802A comprises a first device structure (i.e., field-effect transistor) 808A disposed over an oxide layer 810A. In some embodiments, the first device structure 808A is disposed over the substrate with no intervening oxide layer 810A. A first local via 812A connects the first device structure 808A to a first metallization plane 814A. Likewise, the second tier 804A comprises a second device structure 816A disposed over an inter-layer dielectric (ILD) 818A. In some embodiments, the ILD 818A comprises nearly pure Si with a thickness of less than about 1,000 nm. A second local via 812A connects the second device structure 816A to a second metallization plane 814A. An inter-tier via 824A connects the first and second device structures 808A, 816A through the second metallization plane 814A. In some embodiments, the first and second device structures 808A, 816A reside inside Iv0 and Iv1 memory cells (106 of FIG. 1), respectively. In some embodiments, the inter-tier via has a diameter of less than about 100 nm. In some embodiments, the first and second tiers 802A, 804A enclosed by a single integrated circuit package.

Figure 8B:
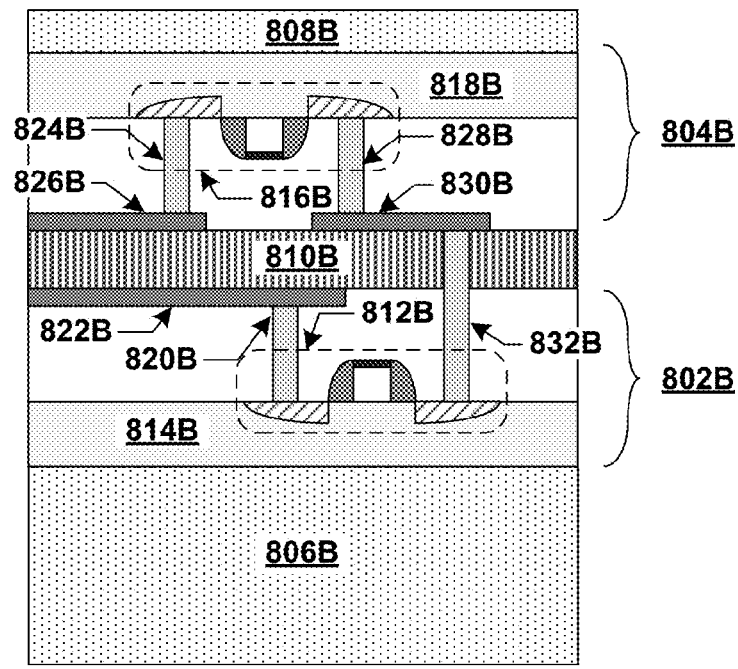

FIG. 8B illustrates a cross-sectional view of some embodiments of a memory device 800B comprising a 3D-IC, further comprising a first tier 802B vertically disposed below a second tier 804B. The first tier 802B is disposed on a first semiconductor substrate 806B, and the second tier 804B is disposed on a second semiconductor substrate 808B, which has been flipped and bonded to the first tier 802B by an epoxy 810B to form a face-to-face 3D-IC.

The first tier 802B comprises a first device structure 812B disposed over a first oxide layer 814B. The second tier 804B comprises a second device structure 816B disposed over a second oxide layer 818B. In some embodiments, the first or second device structure 812B, 816B is disposed over the first or second substrate 806B, 808B with no intervening first or second oxide layer 814B, 818B. A first local via 820B connects the first device structure 812B to a first metallization plane 822B within the first tier 802B. Second and third local vias 824B, 828B connect the second device structure 816B to second and third metallization planes 826B, 830B, respectively. An inter-tier via 832B connects the first and second device structures 812B, 816B through the third metallization plane 830B. In some embodiments, the first and second tiers 802B, 804B enclosed by a single integrated circuit package.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein;

such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a memory device wherein a single memory cell array is partitioned between two or more tiers which are vertically integrated on a single substrate. The memory device also includes support circuitry including a control circuit configured to read and write data to the memory cells on each tier, and a shared input/output (I/O) architecture which is connected the memory cells within each tier and configured to receive input data word prior to a write operation, and further configured to provide output data word after a read operation. Other devices and methods are also disclosed.

In some embodiments, the present disclosure relates to a memory device comprising a first memory cell array on a first tier, and a second memory cell array on a second tier, the second tier being arranged in an integrated circuit package which encloses both the first and second tiers so the second tier is arranged over the first tier, or vice versa. The memory device further comprises a control circuit configured to perform a first read/write operation by writing a first data value to a first group of memory cells on the first tier while concurrently reading a second data value from a second group of memory cells on the second tier.

In some embodiments, the present disclosure relates to a method to read and write memory, comprising partitioning a memory array into first and second tiers, wherein the second tier resides over the first tier, and performing a first read/write operation by writing a first data value to a first group of memory cells on the first tier while concurrently reading a second data value from a second group of memory cells on the second tier.

In some embodiments, the present disclosure relates to a memory device comprising first and second memory cell arrays arranged in an integrated circuit package and residing on first and second tiers, respectively, where the second tier is arranged over the first tier, or vice versa. The memory device further comprises a control circuit configured to perform a write operation by partitioning an N-bit input data word into first and third data values each comprising N/2-bits, writing the first data value to a first group of memory cells on the first tier in a first interval, and writing the third data value to a third group of memory cells on the second tier in a second interval. The control circuit is further configured to perform a read operation by reading a second data value from a second group of memory cells on the second tier in the first interval, reading a fourth data value from a fourth group of memory cells on the first tier in the second interval, wherein the second and fourth data values each comprise N/2-bits, and assembling the second and fourth data values into a N-bit output data word. The memory device further comprises a shared input/output (I/O) architecture which is connected the first and second tiers and configured to receive the N-bit input data word prior to the write operation and further configured to output the N-bit output data word after the read operation.

What is claimed is:

1. A memory device comprising:
   a first memory cell array on a first tier;
   a second memory cell array on a second tier, the second tier being arranged in an integrated circuit package which encloses both the first and second tiers so the second tier is arranged over the first tier, or vice versa;
   a control circuit configured to perform a first read/write operation during a first time interval by writing a first data value to a first group of memory cells on the first tier while concurrently reading a second data value from a second group of memory cells on the second tier;
   wherein the control circuit is further configured to perform a second read/write operation during a second time interval by writing a third data value to a third group of memory cells on the second tier while concurrently reading a fourth data value from a fourth group of memory cells on the first tier, the second time interval being after the first time interval; and
   wherein the first data value and third data value are collectively made up of N-bits and collectively correspond to an N-bit input data word provided onto input pins of the memory device at a first time prior to the first time interval.

2. The memory device of claim 1, wherein the second data value and fourth data value are collectively made up of N-bits and collectively correspond to an N-bit output data word provided onto output pins of the memory device at a second time after the second read/write operation.

3. The memory device of claim 1, further comprising a shared input/output (I/O) architecture which is connected the first and second tiers and configured to receive the first and second data values as inputs and outputs, respectively, of the first read/write operation.

4. The memory device of claim 3, wherein the shared I/O architecture is further configured to receive the third and fourth data values as inputs and outputs, respectively, of the second read/write operation.

5. The memory device of claim 4, wherein the shared I/O architecture comprises shared write elements on the first tier, the shared write elements configured to receive the first and third data values from input pins of the memory device, to write the first data value to the first group of memory cells on the first tier, and to successively write the third data value to the third group of memory cells on the second tier.

6. The memory device of claim 5, wherein the shared I/O architecture further comprises shared read elements on the second tier arranged over the shared write elements on the first tier, the shared read elements configured to read the second data value from the second group of memory cells on the second tier, to successively read the fourth data value from the fourth group of memory cells on the first tier, and to provide the second and fourth data values to output pins of the memory device.

7. The memory device of claim 4, wherein a connection between the first and second tiers comprise inter-tier vias with a diameter of less than 100 nm.

8. The memory device of claim 1, wherein the first and second tiers reside on first and second substrates which are enclosed by the integrated circuit package.

9. The memory device of claim 1, wherein the first and second tiers reside on a single substrate, and are enclosed by the integrated circuit package.

10. The memory device of claim 1, wherein the first and second memory cell arrays are made up of static random access memory (SRAM) cells.

11. The memory device of claim 1, wherein the first data value corresponds to even bits of the N-bit input data word, and wherein the third data value corresponds to odd bits of the N-bit input data word.

12. A method to read and write to a memory device, comprising:
partitioning a memory array into first and second tiers, wherein the second tier resides over the first tier;
receiving an N-bit data word at an interface of the memory device at a first time;
after the N-bit data word has been received, performing a first read/write operation by writing a first data value, which corresponds to a first portion of the N-bit data word, to a first group of memory cells on the first tier while concurrently reading a second data value from a second group of memory cells on the second tier; and
after the first read/write operation has been performed, performing a second read/write operation by writing a third data value, which corresponds to a second portion of the N-bit data word, to a third group of memory cells on the second tier while concurrently reading a fourth data value from a fourth group of memory cells on the first tier.

13. The method of claim 12, wherein partitioning the memory array into first and second tiers comprises:
forming a first sub-array comprising M rows and N/2 columns;
forming a second sub-array comprising M rows and N/2 columns;
wherein the N/2 columns of the first sub-array comprise odd numbered columns of the memory array; and
wherein the N/2 columns of the second sub-array comprise even numbered columns of the memory array.

14. The method of claim 13, wherein the first data value is made up of N/2-bits and the third data value is made up of N/2-bits such that the first and third data values collectively correspond to the N-bit data word provided to the memory array prior to the first read/write operation.

15. The method of claim 14, wherein the first data value is written to the first sub-array during a first time interval and the third data value is written to the second sub-array during a second time interval, and wherein the second time interval directly follows the first time interval.

16. The method of claim 15, wherein the second data value is made up of N/2-bits and the fourth data value is made up of N/2-bits such that the second and fourth data values collectively correspond to an N-bit output data word provided by the memory array after the first read/write operation.

17. The method of claim 16, wherein the second data value is read from the second sub-array during the first time interval and the fourth data value is read from the first sub-array during the second time interval.

18. A memory device comprising:
first and second memory cell arrays arranged in an integrated circuit package and residing on first and second tiers, respectively, wherein the second tier is arranged over the first tier, or vice versa;
a control circuit configured to:
perform a write operation by partitioning an N-bit input data word, which is received on input pins of the memory device at a first time, into first and third data values each comprising N/2-bits, writing the first data value to a first group of memory cells on the first tier during a first time interval after the first time, and writing the third data value to a third group of memory cells on the second tier during a second time interval after the first time interval; and
perform a read operation by reading a second data value from a second group of memory cells on the second tier during the first time interval in which the first data value is written to the first group of memory cells, reading a fourth data value from a fourth group of memory cells on the first tier during the second time interval in which the third data value is written to the third group of memory cells, wherein the second and fourth data values each comprise N/2-bits, and assembling the second and fourth data values into a N-bit output data word that is output to output pins of the memory device at a second time that is after the second time interval; and
a shared input/output (I/O) architecture which is connected the first and second tiers and configured to receive the N-bit input data word prior to the write operation and further configured to output the N-bit output data word after the read operation.

19. The memory device of claim 18, wherein the first and second memory cell arrays are made up of static random access memory (SRAM) cells.

20. The memory device of claim 18,
wherein the first group of memory cells on the first tier are written to during the first time interval with data corresponding to exclusively odd bit positions within the N-bit input data word; and
wherein the third group of memory cells on the second tier are written to during the second time interval with data corresponding to exclusively even bit positions within the N-bit input data word.

* * * * *